(12) United States Patent
Sun (10) Patent No.: US 7,304,850 B1
(45) Date of Patent: Dec. 4, 2007

(54) MOUNTING APPARATUS FOR SECURING HEAT DISSIPATION MODULE TO CIRCUIT BOARD

(75) Inventor: Ke Sun, Shenzhen (CN)

(73) Assignees: Hong Fu Jin Precision Industry (Shenzhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,709

(22) Filed: Sep. 15, 2006

(30) Foreign Application Priority Data

Dec. 21, 2005 (CN) .......................... 200510121027

(51) Int. Cl.
*H05K 7/20* (2006.01)
(52) U.S. Cl. ...................................... 361/709
(58) Field of Classification Search ................ 361/707, 361/709, 697, 702, 753, 809; 174/16.3; 439/563, 439/564, 569
See application file for complete search history.

(56) References Cited

U.S. PATENT DOCUMENTS

| | | | | |
|---|---|---|---|---|
| 4,159,506 A | * | 6/1979 | Latasiewicz et al. | 361/753 |
| 4,167,031 A | * | 9/1979 | Patel | 361/709 |
| 4,321,423 A | * | 3/1982 | Johnson et al. | 174/16.3 |
| 5,412,535 A | | 5/1995 | Chao et al. | |
| 2006/0042787 A1 | | 3/2006 | Yu et al. | |

* cited by examiner

*Primary Examiner*—Chandrika Prasad
(74) *Attorney, Agent, or Firm*—Wei Te Chung (57) ABSTRACT

A mounting apparatus is provided for securing a heat dissipation module to a circuit board. A chip socket is placed on a top surface of the circuit board. The mounting apparatus comprises a plurality of posts detachably attached to the circuit board adjacent the chip socket, a support frame detachably attached to the heat dissipation module, and a plurality of connecting members respectively detachably attached to the posts. The support frame is attached to the connecting members by a plurality of fasteners, thereby securing the heat dissipation module to the circuit board and suspending the heat dissipation module over the chip socket. The mounting apparatus is provided for two mounting positions, one for during shipment of the circuit board and heat dissipation module, and the other one for operation of same.

11 Claims, 7 Drawing Sheets

MOUNTING APPARATUS FOR SECURING HEAT DISSIPATION MODULE TO CIRCUIT BOARD

1. FIELD OF THE INVENTION

The present invention relates to mounting apparatuses, and more particularly to a mounting apparatus for securing a heat dissipation module to a circuit board and allowing the heat dissipation module and the circuit board being packed together during transportation.

2. DESCRIPTION OF RELATED ART

Figure 6:
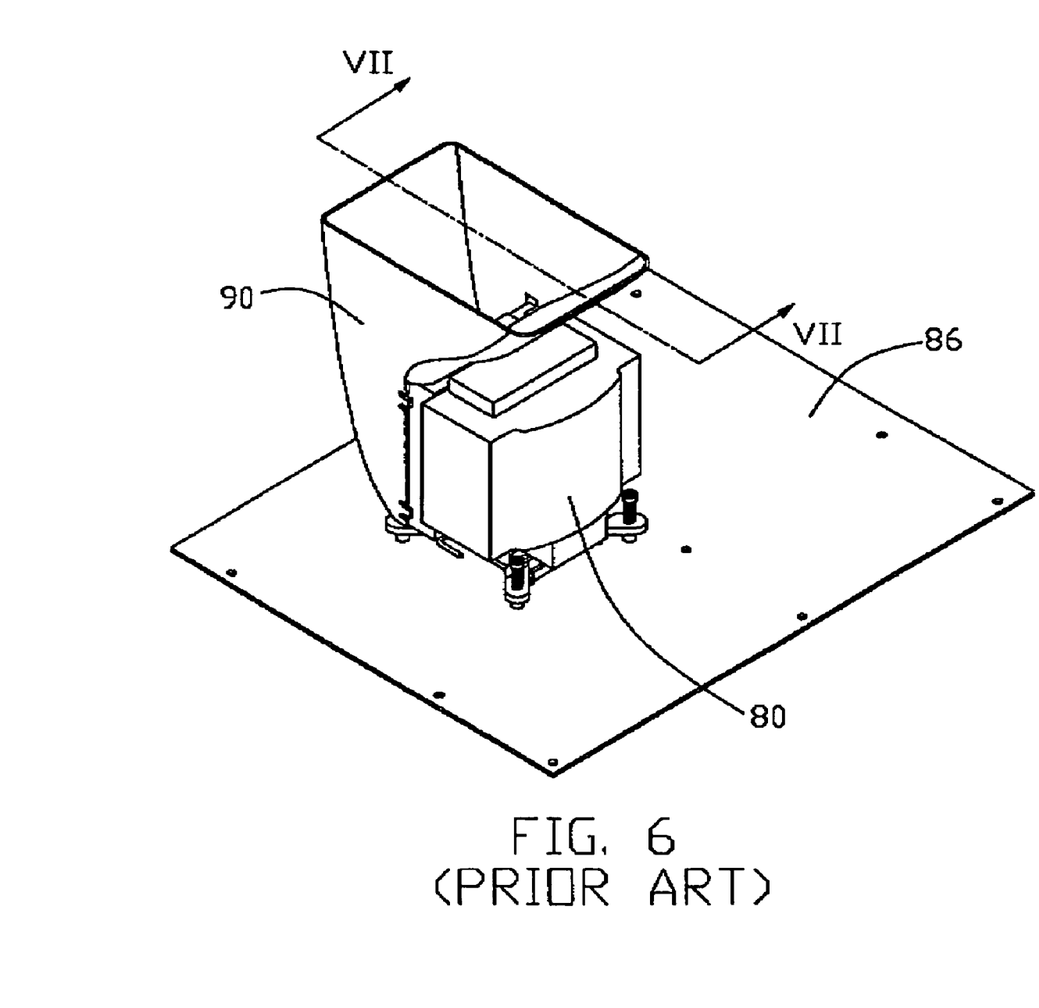
FIG. 6 is a perspective view in accordance with a conventional mounting apparatus for securing a heat dissipation module to a circuit board.
Figure 7:
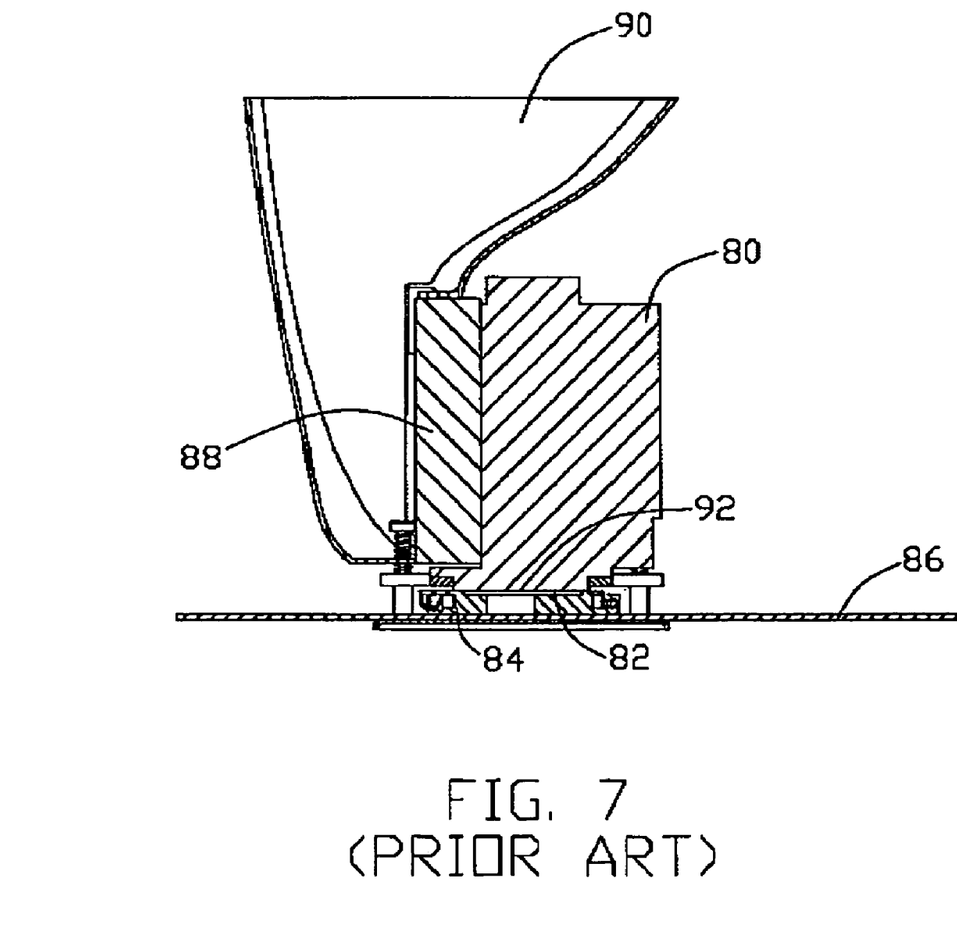
FIG. 7 is a cross-sectional view of FIG. 6 taken along line VII-VII.

In computer systems, certain electronic components such as central processing units (CPUs) generate large amounts of heat during their normal operation. The heat must be quickly removed to prevent the CPUs from becoming overheated or even being damaged due to heat. Referring to FIGS. 6 and 7, a heat sink 80 is attached to a CPU 82 superimposed on a socket 84 of a circuit board 86 to facilitate dissipation of heat from the CPU 82, and a cooling fan 88 is provided for circulating air across the heat sink 80 so as to enhance the heat dissipation rate of the heat sink 80. An air duct 90 is attached to the cooling fan 88 by surrounding an exterior periphery of the cooling fan 88, and provides a passageway for air to travel between the heat sink 80 and an exterior of a computer chassis of a computer system. A thermal interface material such as a layer of thermal grease 92 is evenly spread on a middle portion of the bottom of the heat sink 80 and adjoins a top surface of the CPU 82 to create a low resistance thermal path that ensures a proper operating temperature for the CPU 82.

However, when computer systems are transported by original equipment manufacturers (OEMs) to their customers, heat dissipation modules including heat sinks and circuit boards are typically separately packed and transported to customers because there are protective covers covering the thermal grease spread on the heat sinks and sockets on the circuit boards which prevent the heat sinks from being attached to the circuit boards. Therefore, packing and transportation costs for the heat dissipation modules and circuit boards constitute an unduly large part of total costs of the computer systems.

What is desired, therefore, is a mounting apparatus which secures a heat dissipation module to a circuit board and allows the heat dissipation module and the circuit board being packed together in transportation.

SUMMARY OF THE INVENTION

In one preferred embodiment, a mounting apparatus is provided for securing a heat dissipation module to a circuit board. A chip socket is placed on the circuit board. The mounting apparatus comprises a plurality of posts detachably attached to the circuit board adjacent the chip socket, a support frame detachably attached to the heat dissipation module, and a plurality of connecting members respectively detachably attached to the posts. The support frame is attached to the connecting members by a plurality of fasteners, thereby securing the heat dissipation module to the circuit board and suspending the heat dissipation module over the chip socket.

Other advantages and novel features will become more apparent from the following detailed description of preferred embodiments when taken in conjunction with the accompanying drawings, in which:

DETAILED DESCRIPTION OF THE INVENTION

Figure 1:
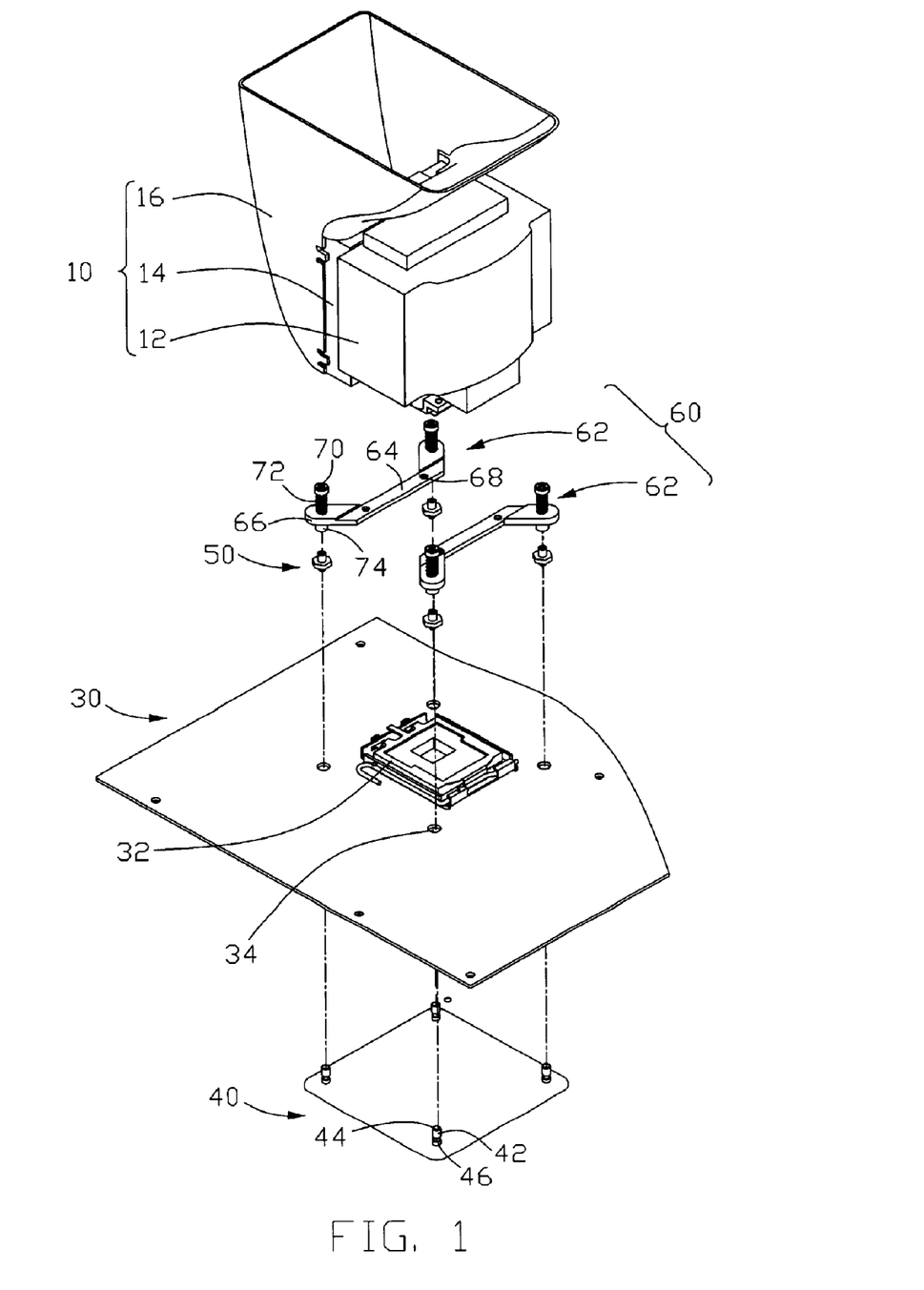
FIG. 1 is an exploded perspective view of a mounting apparatus for securing a heat dissipation module to a circuit board in accordance with a preferred embodiment of the present invention, wherein a cut away view of a circuit board is shown.
Figure 2:
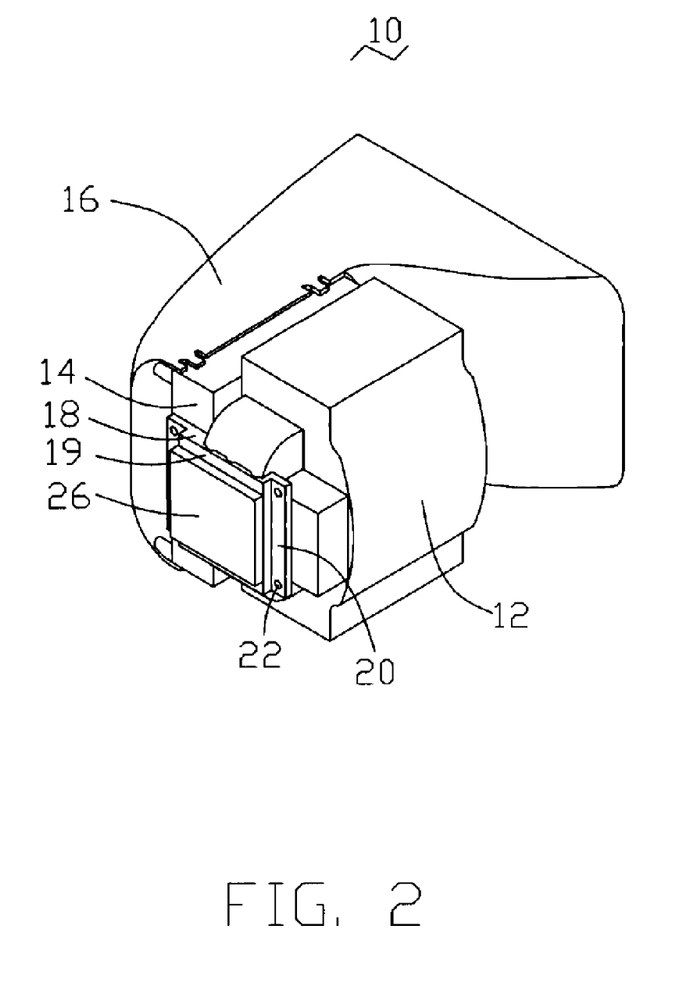
FIG. 2 is a perspective view of the heat dissipation module of FIG. 1, but viewed from another aspect.
Figure 5:
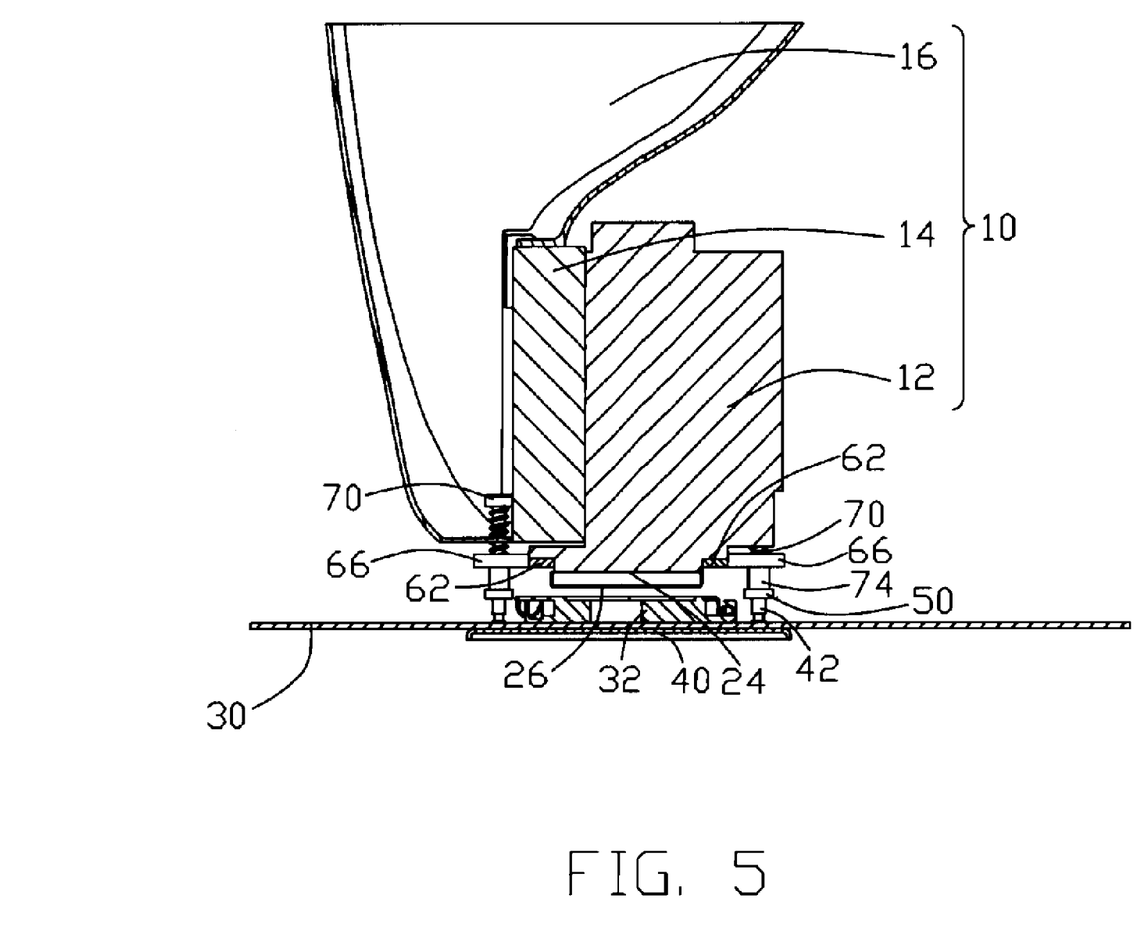
FIG. 5 is a cross-sectional view of FIG. 4 taken along line V-V.

Referring to FIGS. 1 and 2, in a preferred embodiment of the invention, a mounting apparatus is provided for securing a heat dissipation module 10 to a circuit board 30. The heat dissipation module 10 includes a heat sink 12, a cooling fan 14 attached to one side of the heat sink 12, and an air duct 16 enclosing an exterior periphery of the cooling fan 14 and providing a passageway for air to travel between the heat sink 12 and an exterior of a computer chassis. The heat sink 12 is provided with a thermal conductive base 18, and the base 18 comprises a contact portion 19 and two fixing portions 20 respectively extending outward from two sides of the contact portion 19. Each fixing portion 20 defines two threaded holes 22. The contact portion 19 is configured for contacting with a computer chip such as a central processing unit (CPU). A thermal adhesive 24 such as a layer of thermal grease is spread on a bottom surface of the contact portion 19 to create a low resistance thermal path between the computer chip and the heat sink 12 (see FIG. 5). A protective cover 26 is placed on the contact portion 19 to cover the thermal adhesive 24 and protect the thermal adhesive 24 from dust and possible damage. A socket 32 for receiving the computer chip is placed on a top surface of the circuit board 30. A plurality of bores 34 is defined in the circuit board 30 surrounding the socket 32.

Figure 3:
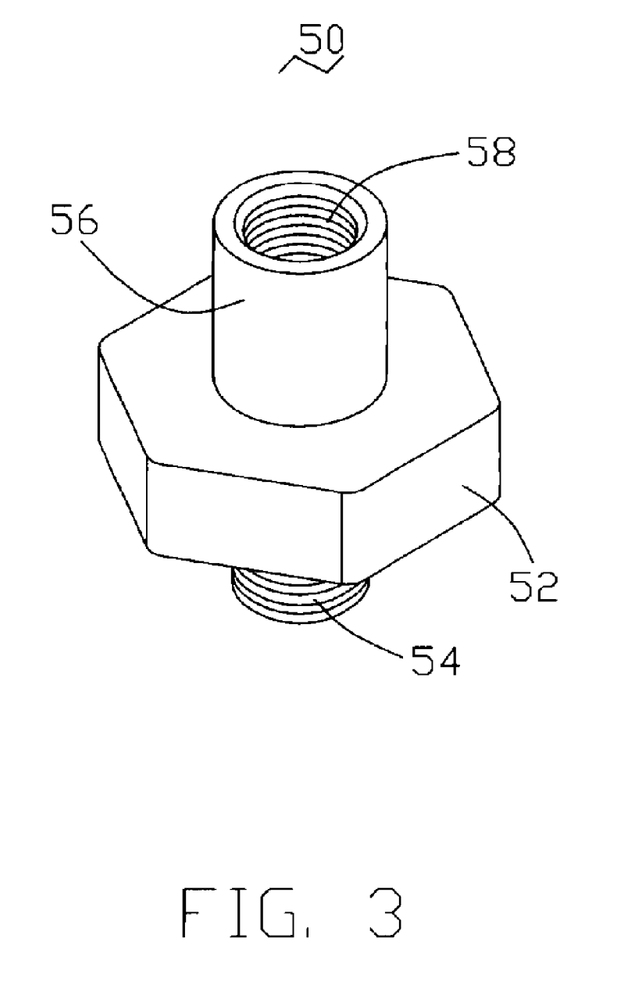
FIG. 3 is an enlarged view of one connecting member of the mounting apparatus of FIG. 1.
Figure 4:
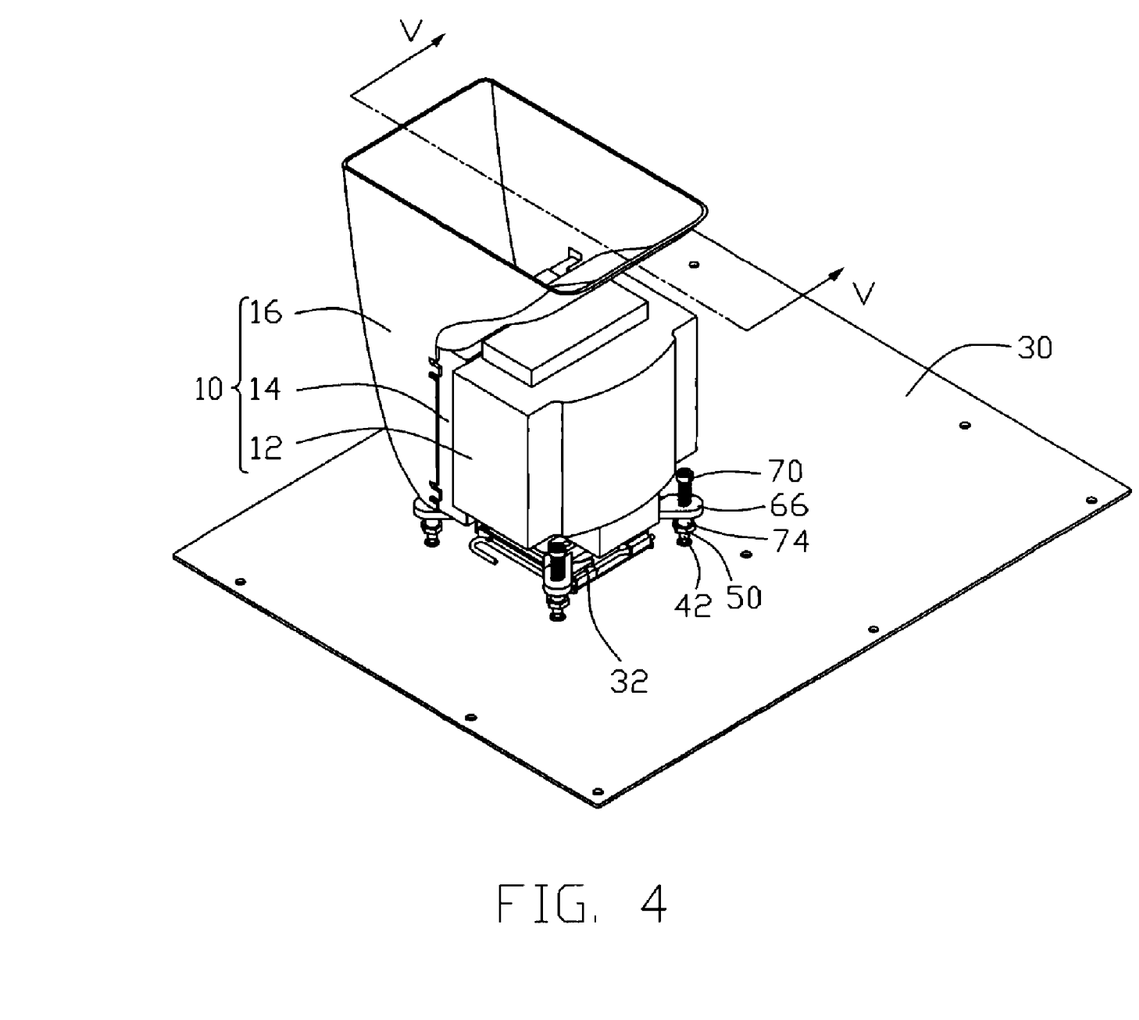
FIG. 4 is an assembled view of FIG. 1.

In the present embodiment, the mounting apparatus includes a bolster plate 40 attached to a bottom surface of the circuit board 30, a plurality of connecting members 50, and a support frame 60. A plurality of posts 42 projects upwardly from a top surface of the bolster plate 40 respectively adjacent four corners thereof, corresponding to the bores 34 of the circuit board 30. Each post 42 defines a threaded hole 44 in a free end thereof, and an encircling mounting groove 46 is defined adjacent a bottom end of each post 42. Referring also to FIG. 3, the connecting members 50 each include a flange portion 52, and a coupling portion 54 and a support portion 56 respectively extending down from a lower surface and up from an upper surface of the flange portion 52. The flange portion 52 of each connecting member 50 has a polygonal shape such as a hexagon shape to facilitate manipulation thereof. The coupling portion 54 of each connecting member 50 has male threads at a free end thereof, and the support portion 56 of each connecting member 50 defines an internally threaded opening 58 therein. The support frame 60 includes two fixtures 62 respectively attached to the two fixing portions 20 of the base 18. Each of the fixtures 62 includes a rail 64 with two legs 66 respectively extending aslant from two ends of the rail 64 in directions away from each other. Two apertures 68 are defined in the rail 64 of each fixture 62, corresponding to the threaded holes 22 of corresponding fixing portions 20 of the base 18. Two fasteners 70 such as screws, are provided for extending through the two legs 66 of each fixture 62. A spring 72 is attached around each fastener 70 and compressed between a head of each fastener 70 and the corresponding leg 66 of each fixture 62. A hollow pole 74 extends down from a lower surface of each leg 66 of each fixture 62, allowing the corresponding fastener 70 extending therethrough.

Referring to FIGS. 1 to 5, in assembly, the posts 42 of the bolster plate 40 are respectively inserted through the bores 34 of the circuit board 30, the bolster plate 40 abuts against the bottom surface of the circuit board 30 and the posts 42 extend out from the top surface of the circuit board 30. The mounting grooves 46 of the posts 42 are generally positioned over the top surface of the circuit board 30. A plurality of hollow rubber bushes (not shown) is respectively assembled to the posts 42 by snappingly fitting in the mounting grooves 46 thereof, a periphery of each rubber bush abuts against the top surface of the circuit board 30 thereby securing the bolster plate 40 to the circuit board 30. The connecting members 50 are respectively attached to the posts 42 via the coupling portions 54 of the connecting members 50 being respectively screwed into the threaded holes 44 of the posts 42. The two fixtures 62 are respectively secured to the base 18 of the heat sink 12 of the heat dissipation module 10 via a plurality of screws (not shown) being respectively passed through the apertures 68 of the two fixtures 62 and screwed into the corresponding threaded holes 22 of the two fixing portions 20 of the base 18.

The combined heat dissipation module 10 and two fixtures 62 are disposed on the circuit board 30, the support portions 56 of the connecting members 50 are respectively received into the hollow poles 74 of the two fixtures 62, and free ends of the hollow poles 74 of the two fixtures 62 respectively engage the corresponding flange portions 52 of the connecting members 50. The fasteners 70 are extended through the corresponding hollow poles 74 and respectively screwed into the threaded openings 58 of the corresponding support portions 56, thereby securing the heat dissipation module 10 to the circuit board 30. The heat dissipation module 10 is supported over the socket 32, thereby leaving a space between the socket 32 and the protective cover 26 covering the contact portion 19 of the base 18 of the heat sink 12.

Once the circuit board 30 combined with the heat dissipation module 10 is received by a customer, the fasteners 70 of the two fixtures 62 are respectively unscrewed from the corresponding threaded openings 58 of the connecting members 50, and the heat dissipation module 10 is detached from the circuit board 30. The coupling portions 54 of the connecting members 50 are unscrewed from the corresponding threaded holes 44 of the posts 42 of the bolster plate 40, and the connecting members 50 are detached from the posts 42 respectively. The computer chip is installed on the socket 32. The cover 26 is removed from the contact portion 19 of the base 18 of the heat sink 12, and the heat dissipation module 10 combined with the two fixtures 62 is disposed on the circuit board 30, the posts 42 of the bolster plate 40 are respectively received in the hollow poles 74 of the two fixtures 62, and the free ends of the hollow poles 74 respectively engage the top surface of the circuit board 30. The fasteners 70 are respectively screwed into the corresponding threaded holes 44 of the posts 42, thereby securing the heat dissipation module 10 to the circuit board 30.

The mounting apparatus of the present invention allows for two mounting positions, one which accommodates safe shipping by providing a space between surfaces needing protection, and a second one for customer securing the heat dissipation module 10 to the circuit board 30 via the fasteners 70 engaging with the posts 40 directly after the connecting members 50 and cover 26 being removed and contacting the thermal adhesive 24 spread on the contact portion 19 of the heat sink 12 with a top surface of the computer chip.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment.

What is claimed is:

1. A mounting apparatus for securing a heat dissipation module to a circuit board, the circuit board including a chip socket, the mounting apparatus comprising:
    a plurality of posts for being detachably attached to the circuit board adjacent the chip socket, each of the posts defining a threaded hole therein;
    a support frame for being attached to the heat dissipation module, a plurality of hollow poles extending down from a lower surface of the support frame;
    a plurality of connecting members each comprising a flange portion, and a coupling portion extending down from a lower surface and a support portion extending up from an upper surface of the flange portion, the coupling portion having male threads formed thereon, the support portion being received in a corresponding pole and defining a threaded opening therein, the connecting members being respectively detachably attached to the posts via the male threads of the coupling portions being respectively screwed into the threaded holes of the posts and supporting the support frame for suspending the heat dissipation module over the chip socket; and
    a plurality of fasteners securing the support frame to the connecting members via the fasteners being respectively extended into the hollow poles of the support frame and screwed into the threaded openings of the corresponding support portions.

2. The mounting apparatus as described in claim 1, wherein the flange portion of each of the connecting members has a polygonal shape.

3. The mounting apparatus as described in claim 1, wherein the support frame comprises two fixtures, each of the two fixtures comprises a rail with two legs respectively extending from two ends of the rail, the hollow poles respectively extend down from lower surfaces of the legs, and the fasteners are respectively extended through the legs of the two fixtures.

4. The mounting apparatus as described in claim 1, wherein a plurality of bores is defined in the circuit board surrounding the chip socket, the mounting apparatus further comprises a bolster plate abutting a bottom surface of the circuit board, and the posts extend out from the bolster plate and are respectively inserted through the bores of the circuit board.

5. A combination comprising:
a circuit board with a socket mounted thereon, the socket being configured for receiving an electronic component thereon;
a plurality of posts attached to the circuit board adjacent the socket;
a thermal module with thermal grease mounted on a bottom surface thereof, a protective cover attached on the bottom surface to cover the thermal grease;
a support frame attached to the thermal module, a plurality of hollow poles extending down from a lower surface of the support frame; and
a plurality of connecting members detachably installable to the posts respectively, each of the connecting members comprising an enlarged flange portion supporting a corresponding pole thereon and a support portion extending up from an upper surface of the flange portion and being received in the pole to thereby suspend the thermal module over the socket to prevent the protective cover from interfering with the socket;
wherein a plurality of fasteners extends from the support frame and is engagable with the support portions of the connecting members respectively.

6. The combination as described in claim 5, wherein when the connecting members and the protective cover are removed away and the electronic component is mounted on the socket, the fasteners are engagable with the posts respectively to thereby secure the thermal module to the electronic component.

7. The combination as described in claim 6, wherein the support frame comprises two fixtures each comprising a rail and two legs respectively extending from two ends of the rail, the hollow poles respectively extend down from lower surfaces of the legs of the fixtures, and the fasteners are respectively extended through the legs to engage with the corresponding connecting members.

8. The combination as described in claim 7, wherein each of the posts defines a threaded hole, and each of the connecting members comprises a coupling portion extending from a lower surface of the flange portion and being screwed into a corresponding threaded hole.

9. A combination comprising:
a circuit board with a socket mounted thereon, the socket being configured for receiving an electronic component thereon;
a plurality of posts attached to the circuit board adjacent the socket;
a plurality of connecting members detachably installed to the posts respectively, each of the connecting members comprising an enlarged flange portion, and a support portion extending up from an upper surface of the flange portion;
a support frame supported on the flange portions of the connecting members;
a plurality of fasteners extending from the support frame to engage with the support portions of the connecting members respectively; and
a thermal module secured on the support frame, thermal grease mounted on a bottom surface of the thermal module, a protective cover attached on the bottom surface to cover the thermal grease, a gap being formed between the protective cover and the socket to prevent the protective cover from interfering with the socket, wherein each of the posts defines a threaded hole engagable with a corresponding fastener when the connecting members are detached from the posts.

10. The combination as described in claim 9, wherein each of the connecting members further comprises a coupling portion extending down from a lower surface of the flange portion, male threads being formed around the coupling portion configured to engage with the threaded hole of a corresponding post when the connecting member is attached on the corresponding post.

11. The combination as described in claim 10, wherein a plurality of hollow poles extends down from the support frame, and the support portions of the connecting members are received in the poles respectively.

* * * * *